United States Patent
Chen et al.

(10) Patent No.: US 9,377,596 B2
(45) Date of Patent: Jun. 28, 2016

(54) OPTICAL-ELECTRO CIRCUIT BOARD, OPTICAL COMPONENT AND MANUFACTURING METHOD THEREOF

(71) Applicant: Unimicron Technology Corp., Taoyuan (TW)

(72) Inventors: Yin-Ju Chen, Chiayi County (TW); Cheng-Po Yu, Taoyuan County (TW); Pei-Chang Huang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 14/337,248

(22) Filed: Jul. 22, 2014

(65) Prior Publication Data
US 2016/0025944 A1 Jan. 28, 2016

(51) Int. Cl.
*G02B 6/43* (2006.01)
*G02B 6/42* (2006.01)
*H01L 31/0232* (2014.01)

(52) U.S. Cl.
CPC ............... *G02B 6/43* (2013.01); *G02B 6/4206* (2013.01); *G02B 6/4274* (2013.01); *H01L 31/02327* (2013.01)

(58) Field of Classification Search
CPC .................................... G02B 6/43; G02B 6/42
USPC ..................................................... 385/14, 18
See application file for complete search history.

(56) References Cited

U.S. PATENT DOCUMENTS

| | | | | |
|---|---|---|---|---|
| 4,943,131 | A * | 7/1990 | Taki | G02B 6/12002 385/130 |
| 5,408,559 | A * | 4/1995 | Takahashi | G02B 6/4246 385/89 |
| 5,452,312 | A * | 9/1995 | Yamamoto | G02F 1/3775 372/102 |
| 5,499,309 | A * | 3/1996 | Kozuka | G02B 6/2817 385/38 |
| 5,568,575 | A * | 10/1996 | Sato | G02B 6/4249 385/16 |
| 5,909,524 | A * | 6/1999 | Tabuchi | G02B 6/423 385/14 |
| 6,454,470 | B1 * | 9/2002 | Dwarkin | G02B 6/4214 385/31 |
| 7,120,325 | B1 * | 10/2006 | Uchida | G02B 6/12004 385/14 |
| 8,102,521 | B2 * | 1/2012 | Markwort | G01N 21/9501 356/237.2 |

(Continued)

*Primary Examiner* — Kaveh C Kianni
(74) *Attorney, Agent, or Firm* — Jianq Chyun IP Office

(57) ABSTRACT

An optical component including a multi-layer substrate, an optical waveguide element, and two optical-electro assemblies is provided. The multi-layer substrate includes a dielectric layer, two circuit layers, and two through holes passing through the dielectric layer. The optical waveguide element is located on the multi-layer substrate and between the through holes. The optical-electro assemblies are respectively inserted into the corresponding through holes and correspondingly located at two opposite ends of the optical waveguide element. One of the optical-electro assemblies transforms an electrical signal into a light beam and provides the light beam to the optical waveguide element, and the other one of the optical-electro assemblies receives the light beam transmitted from the optical waveguide element and transforms the light beam into another electrical signal. A manufacturing method of the optical component and an optical-electro circuit board having the optical component are also provided.

4 Claims, 7 Drawing Sheets

(56) References Cited

U.S. PATENT DOCUMENTS

| | | | | |
|---|---|---|---|---|
| 2001/0028768 A1* | 10/2001 | Terashima | G02B 6/42 | 385/49 |
| 2002/0097962 A1* | 7/2002 | Yoshimura | G02B 6/10 | 385/50 |
| 2003/0108269 A1* | 6/2003 | Pogge | G02B 6/12 | 385/14 |
| 2004/0033007 A1* | 2/2004 | Ohtsu | G02B 6/138 | 385/14 |
| 2006/0012967 A1* | 1/2006 | Asai | G02B 6/43 | 361/764 |
| 2006/0051011 A1* | 3/2006 | Ohmori | G02B 6/125 | 385/14 |
| 2006/0093262 A1* | 5/2006 | Matsumoto | G01N 21/7703 | 385/31 |
| 2008/0285910 A1* | 11/2008 | Yamada | G02B 6/12002 | 385/14 |
| 2009/0010591 A1* | 1/2009 | Iwamori | G02B 6/12002 | 385/14 |
| 2009/0028497 A1* | 1/2009 | Kodama | G02B 6/43 | 385/14 |
| 2009/0180732 A1* | 7/2009 | Takai | G02B 6/42 | 385/14 |
| 2009/0257713 A1* | 10/2009 | Itagaki | G02B 6/43 | 385/33 |
| 2010/0014806 A1* | 1/2010 | Lee | G02B 6/42 | 385/15 |
| 2010/0215313 A1* | 8/2010 | Matsuoka | G02B 6/43 | 385/14 |
| 2013/0108262 A1* | 5/2013 | Lim | G02B 6/4215 | 398/43 |

\* cited by examiner

OPTICAL-ELECTRO CIRCUIT BOARD, OPTICAL COMPONENT AND MANUFACTURING METHOD THEREOF

FIELD OF THE INVENTION

The invention relates to an optical-electro circuit board; more particularly, the invention relates to an optical component applied to an optical-electro circuit board and a manufacturing method thereof.

DESCRIPTION OF RELATED ART

With the recent advancement of science and technology, electronic products such as notebook computers (NB), tablet computers, and smart phones have been frequently applied in our daily lives. Due to the increasing types and the diverse functions of the electronic products, circuit boards applied to the electronic products have been playing an important role in the pertinent field. To expand the application field of the circuit board, the circuit board can be designed to be in form of a multi-layer circuit board according to actual needs, so as to increase the internal space of the circuit board for circuit layout. Electronic elements of different types, such as connectors, chips, or optical-electro elements, may be further arranged on the circuit board to expand the functions of the circuit board based on the actual demands.

A multi-layer circuit board having a plurality of optical-electro elements is taken for example herein. Please refer to FIG. 1 which is a schematic diagram illustrating a conventional optical-electro circuit board. The optical-electro circuit board 10 depicted in FIG. 1 includes a multi-layer circuit board 12, two chips 14a and 14b, an optical waveguide element 16, and two optical-electro elements 18a and 18b are arranged on or embedded in the multi-layer circuit board 12. Specifically, the chips 14a and 14b are configured on the surface of the multi-layer circuit board 12, and the optical-electro elements 18a and 18b are embedded in the multi-layer circuit board 12 and connected to the chips 14a and 14b, respectively. Besides, the optical waveguide element 16 is embedded in the multi-layer circuit board 12, and two opposite sides of the core layer of the optical waveguide element 16 are cut to form 45-degree inclined surfaces. Here, the optical-electro elements 18a and 18b are located above the optical waveguide element 16 and respectively face the two inclined surfaces of the core layer of the optical waveguide element 16. Thereby, the chip 14a is able to provide an electrical signal to the optical-electro element 18a, so as to drive the optical-electro element 18a to transform the electrical signal into a light beam; as such, the optical-electro element 18a above the optical waveguide element 16 provides the light beam in a downward direction to the optical waveguide element 16. Through one of the inclined surfaces of the optical waveguide element 16, the transmission path of the light beam becomes horizontal; after the light beam is transmitted to the other inclined surface of the optical waveguide element 16, the transmission path of the light beam is changed again, and the light beam is transmitted in an upward manner to the optical-electro element 18b (shown by the arrow in FIG. 1) above the optical waveguide element 16. The optical-electro element 18b receives the light beam transmitted from the optical waveguide element 16 and transforms the light beam into an electrical signal, and the electrical signal is received by the chip 14b.

In order for the optical-electro circuit board 10 to perform the optical-electro conversion function, the chips 14a and 14b, the optical waveguide element 16, and the optical-electro elements 18a and 18b need be arranged on the multi-layer circuit board 12, which requires a relatively large layout space on the surface of the optical-electro circuit board 10. Thereby, the change to the dimension of the optical-electro circuit board 10 is subject to the locations of said elements. In addition, during the optical-electro conversion, the light beam transmitted between the optical waveguide element 16, and the optical-electro elements 18a and 18b may have a different transmission path once the light beam is transmitted to the inclined surfaces of the optical waveguide element 16. Such transmission and conversion of the light beam may lead to light loss. Moreover, the surface accuracy of the inclined surfaces of the optical waveguide element 16 for changing the transmission path of the light beam may also pose an impact on the light beam transmission efficiency, which further reduces the optical efficiency of the optical-electro circuit board.

SUMMARY OF THE INVENTION

Embodiments of the invention provide an optical component and a manufacturing method thereof for reducing light loss and ensuring favorable optical efficiency.

Embodiments of the invention provide an optical-electro circuit board capable of reducing light loss and ensuring favorable optical efficiency and enable to reduce the space required for surface layout thereof.

In an embodiment of the invention, a manufacturing method of an optical component includes following steps: providing a multi-layer substrate comprising at least one dielectric layer, at least two circuit layers, and two through holes passing through the at least one dielectric layer, wherein the at least two circuit layers are located on two opposite surfaces of the at least one dielectric layer; forming an optical waveguide element on a surface of the multi-layer substrate and between the through holes; forming two optical-electro assemblies in the corresponding through holes. Here, the optical-electro assemblies are correspondingly located at two opposite ends of the optical waveguide element.

In an embodiment of the invention, an optical component that includes a multi-layer substrate, an optical waveguide element, and two optical-electro assemblies is provided. The multi-layer substrate includes at least one dielectric layer, at least two circuit layers, and two through holes passing through the at least one dielectric layer, and the at least two circuit layers are located on two opposite surfaces of the at least one dielectric layer. The optical waveguide element is located on a surface of the multi-layer substrate and between the through holes. The optical-electro assemblies are respectively inserted into the corresponding through holes and correspondingly located at two opposite ends of the optical waveguide element. One of the optical-electro assemblies transforms an electrical signal into a light beam and provides the light beam to the optical waveguide element, and the other one of the optical-electro assemblies receives the light beam transmitted from the optical waveguide element and transforms the light beam into another electrical signal.

In an embodiment of the invention, an optical-electro circuit board that includes a multi-layer circuit board, an optical component, and two chips is provided. The multi-layer circuit board includes a plurality of circuit layers and a plurality of dielectric layers between the circuit layers, and the multi-layer circuit board has a groove extending from a surface of the multi-layer circuit board into the circuit layers. The optical component is arranged in an upside down manner and assembled into the groove of the multi-layer circuit board, and the optical component includes a multi-layer substrate, an optical waveguide element, and two optical-electro assemblies. The multi-layer substrate includes at least one dielectric layer, at least two circuit layers, and two through holes passing through the at least one dielectric layer, and the at least two circuit layers are located on two opposite surfaces of the at least one dielectric layer. The optical waveguide element is located on a surface of the multi-layer substrate and between the through holes, and the optical waveguide element faces a bottom of the groove. The optical-electro assemblies are respectively inserted into the corresponding through holes and correspondingly located at two opposite ends of the optical waveguide element. Here, one of the optical-electro assemblies transforms an electrical signal into a light beam and provides the light beam to the optical waveguide element, and the other one of the optical-electro assemblies receives the light beam transmitted from the optical waveguide element and transforms the light beam into another electrical signal. The chips are located outside the groove and electrically connected to the corresponding optical-electro assemblies, respectively, wherein one of the chips provides the electrical signal to the corresponding optical-electro assembly, and the other one of the chips receives the electrical signal transmitted from the other corresponding optical-electro assembly.

According to an embodiment of the invention, a method of forming the optical-electro assemblies in the corresponding through holes includes: providing a substrate and forming a light guide hole on the substrate, wherein the light guide hole passes through the substrate; cutting the substrate to form an insertion element, wherein the insertion element includes an insertion portion and a light guide portion connected to the insertion portion, and the light guide hole is located on the light guide portion; forming a conductive layer on the insertion element; placing an optical-electro element on the corresponding light guide portion, so as to connect the conductive layer and face the light guide hole; inserting the insertion portion into the corresponding through hole. Here, the light guide portion and the light guide hole are located corresponding to one end of the optical waveguide element, such that the optical-electro element transmits the light beam to the optical waveguide element through the light guide hole or receives the light beam transmitted by the optical waveguide element through the light guide hole.

According to an embodiment of the invention, the manufacturing method of the optical component further includes: placing two light focusing lenses on two opposite sides of the optical waveguide element; here, each of the optical-electro assemblies faces one of the corresponding light focusing lenses.

According to an embodiment of the invention, each of the optical-electro assemblies includes an insertion element, a conductive layer, and an optical-electro element. The insertion element includes an insertion portion, a light guide portion connected to the insertion portion, and a light guide hole passing through the light guide portion. The insertion portion is inserted into the corresponding through hole, and the light guide portion and the light guide hole are located corresponding to one end of the optical waveguide element. The conductive layer is located on the insertion element. The optical-electro element is located on one end of the corresponding light guide portion away from the optical waveguide element, connected to the conductive layer and facing the light guide hole, so as to transmit the light beam to the optical waveguide element through the light guide hole or receive the light beam transmitted by the optical waveguide element through the light guide hole.

According to an embodiment of the invention, a width of each of the light guide portions is greater than a width of one of the corresponding through holes, so as to position the insertion element through the light guide portion after the insertion element is inserted into the corresponding through hole through the insertion portion.

According to an embodiment of the invention, the optical component further includes two light focusing lenses located on two opposite sides of the optical waveguide element, and each of the optical-electro assemblies faces one of the corresponding light focusing lenses.

According to an embodiment of the invention, the chips are located on the corresponding optical-electro assemblies.

According to an embodiment of the invention, the chips are located on the surface of the multi-layer circuit board and connected to the corresponding optical-electro assemblies through a plurality of corresponding bonding wires.

As provided above, in the optical component and the manufacturing method thereof described herein, two optical-electro assemblies are inserted into two through holes of the multi-layer substrate, such that the optical-electro assemblies are located at two respective sides of the optical waveguide element. One of the optical-electro assemblies transforms an electrical signal into a light beam and directly transmits the light beam to the optical waveguide element, and the other one of the optical-electro assemblies directly receives the light beam transmitted from the optical waveguide element and transforms the light beam into another electrical signal, so as to reduce light loss. Thereby, the optical component and the manufacturing method thereof described herein can achieve favorable optical efficiency. Besides, the optical component in the optical-electro circuit board described herein is arranged in an upside down manner and assembled into the groove of the multi-layer circuit board, such that the light beam transmitted between the optical-electro assemblies and the optical waveguide element is within the groove. As such, the optical-electro circuit board described herein is capable of ensuring favorable optical efficiency, and enables to reduce the space required for surface layout thereof.

Several exemplary embodiments accompanied with figures are described in detail below to further describe the invention in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1:
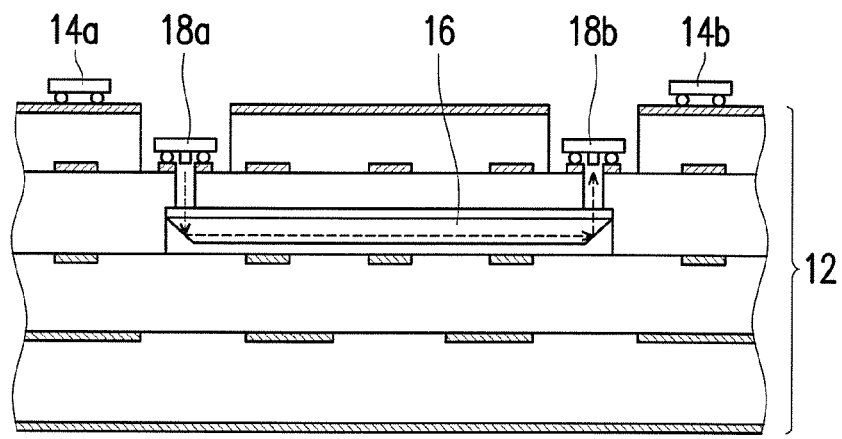
FIG. 1 is a schematic diagram illustrating a conventional optical-electro circuit board.
Figure 2:
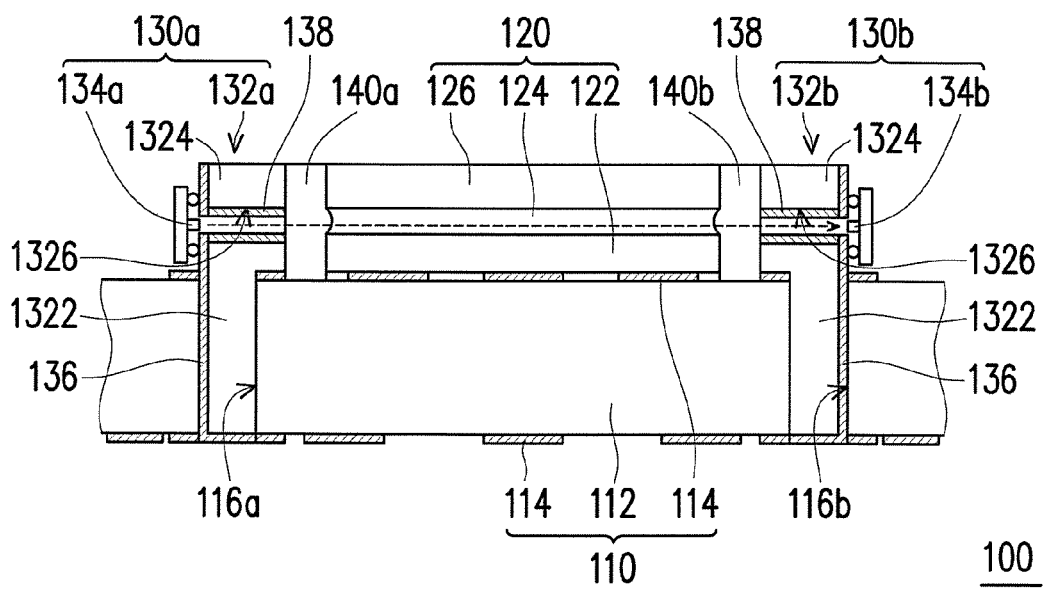
FIG. 2 is a schematic view illustrating an optical component according to an embodiment of the invention.

FIG. 2 is a schematic view illustrating an optical component according to an embodiment of the invention. With reference to FIG. 2, in the present embodiment of the invention, an optical component 100 includes a multi-layer substrate 110, an optical waveguide element 120, and two optical-electro assemblies 130a and 130b. The multi-layer substrate 110 includes at least one dielectric layer 112, at least two circuit layers 114, and two through holes 116a and 116b passing through the dielectric layer 112. Here, the multi-layer substrate 110 of the optical component 100 shown in FIG. 2 has one dielectric layer 112 and two circuit layers 114, for instance, whereas the invention is not limited thereto. In the present embodiment, the circuit layers 114 are respectively configured on two opposite surfaces of the dielectric layer 112. However, in other embodiments that are not shown in the drawings, the multi-layer substrate may include two dielectric layers 112 and three circuit layers 114 that are stacked together, and each of the circuit layers 114 may be electrically conducted by one of the dielectric layers 112 through conductive holes not shown in the drawings. The number of the dielectric layers 112 and the number of the circuit layers 114 in the multi-layer substrate are not limited in the invention and may be adjusted according to actual needs.

In the present embodiment, the optical waveguide element 120 is located on a surface of the multi-layer substrate 110 and between the through holes 116a and 116b. The optical waveguide element 120 includes a bottom coverage layer 122, a core layer 124, and a top coverage layer 126, and the core layer 124 is located between the bottom coverage layer 122 and the top coverage layer 126. Besides, the bottom coverage layer 122, the core layer 124, and the top coverage layer 126 of the optical waveguide element 120 are sequentially stacked from bottom to top on the surface of the multi-layer substrate 110. In the present embodiment, the bottom coverage layer 122 and the top coverage layer 126 have the same refractive index smaller than that of the core layer 124. Hence, when the optical waveguide element 120 serves to transmit a light beam, the light beam may be totally reflected at the intersections of the bottom coverage layer 122, the core layer 124, and the top coverage layer 126 of the optical waveguide element 120. The optical-electro assemblies 130a and 130b are respectively inserted into the corresponding through holes 116a and 116b and correspondingly located at two opposite ends of the optical waveguide element 120. Thereby, the optical-electro assemblies 130a and 130b may transmit the light beam through the optical waveguide element 120. In particular, according to the present embodiment, one of the optical-electro assemblies (e.g., the optical-electro assembly 130a) transforms an electrical signal into a light beam and provides the light beam to the optical waveguide element 120, and the other one of the optical-electro assemblies (e.g., the optical-electro assembly 130b) receives the light beam transmitted from the optical waveguide element 120 and transforms the light beam into another electrical signal. As mentioned above, the refractive index of the bottom coverage layer 122 and the top coverage layer 126 is smaller than that of the core layer 124; therefore, when the optical-electro assemblies 130a and 130b transmit the light beam through the optical waveguide element 120, the light beam transmitted by the optical-electro assemblies 130a and 130b may be totally reflected at the intersections of the bottom coverage layer 122, the core layer 124, and the top coverage layer 126 of the optical waveguide element 120.

Besides, in the present embodiment, the optical component 100 further includes two light focusing lenses 140a and 140b located on two opposite sides of the optical waveguide element 120, and each of the optical-electro assemblies 130a and 130b faces one of the corresponding light focusing lenses 140a and 140b, so as to enhance the transmission efficiency of the light beam. The light beam transmitted by the optical-electro assembly 130a can thus be transmitted to the optical waveguide element 120 through the corresponding light focusing lenses 140a, and the light beam is then transmitted to the optical-electro assembly 130b through the optical waveguide element 120 and the corresponding light focusing lenses 140b. However, the light focusing lenses 140a and 140b are not required elements in the invention, and whether to include the light focusing lenses 140a and 140b in the optical component 100 may be determined according to actual needs.

According to the present embodiment, the optical-electro assembly 130a includes an insertion element 132a and an optical-electro element 134a, and the optical-electro assembly 130b includes an insertion element 132b and an optical-electro element 134b. The insertion elements 132a and 132b in the optical-electro assemblies 130a and 130b have the similar structure, while the optical-electro element 134a may be different from the optical-electro element 134b. Each of the insertion elements 132a and 132b includes an insertion portion 1322, a light guide portion 1324 connected to the insertion portion 1322, and a light guide hole 1326 passing through the light guide portion 1324. The insertion portion 1322 is inserted into a corresponding through hole 116a or 116b, and the light guide portion 1324 and the light guide hole 1326 are located corresponding to one end of the optical waveguide element 120 and face the light focusing lens 140a or 140b. According to the present embodiment, a width of each of the light guide portions 1324 is greater than a width of one of the corresponding through holes 116a and 116b, so as to position the insertion elements 132a and 132b through the light guide portions 1324 after the insertion elements 132a and 132b are inserted into the corresponding through holes 116a and 116b through the corresponding insertion portions 1322. Besides, a width of each of the insertion portions 1322 does not exceed the width of the corresponding through hole 116a or 116b, such that the insertion portions 1322 may be respectively inserted into the corresponding through holes 116a and 116b. Thereby, the width of each of the light guide portions 1324 of the insertion elements 132a and 132b is greater than the width of each insertion portion 1322, such that the insertion elements 132a and 132b are shaped as bolts. Each of the optical-electro elements 134a and 134b is located on one end of the corresponding light guide portion 1324 of one of the corresponding insertion elements 132a and 132b away from the optical waveguide element 120 and faces the light guide hole 1326. Thereby, the light beam provided by the optical-electro element 134a of the optical-electro assembly 130a may be transmitted to the optical waveguide element 120 through the light guide hole 1326 of the insertion element 132a, and the optical-electro element 134b of the optical-electro assembly 130b may receive the light beam transmitted by the optical waveguide element 120 through the light guide hole 1326 of the insertion element 132b.

Particularly, in the present embodiment, the optical-electro element 134a of the optical-electro assembly 130a is an electricity-to-light element, such as a vertical cavity surface emission laser (VCSEL) element capable of transforming the received electrical signal into a light beam, and the light beam can then be provided to the optical waveguide element 120. By contrast, the optical-electro element 134b of the optical-electro assembly 130b is a light-to-electricity element, such as a photo detector (PD) capable of receiving the light beam transmitted by the optical waveguide element 120 and transforming the received light beam into another electrical signal. It can be derived from the above that the optical-electro assemblies 130a and 130b of the optical component 100 are respectively configured to provide and receive the light beam, and the light beam is transmitted from the optical-electro assembly 130a to the optical-electro assembly 130b through the optical waveguide element 120. Here, the optical-electro element 134a is aligned to the light guide hole 1326 of the insertion element 132a, the optical-electro element 134b is aligned to the light guide hole 1326 of the insertion element 132b, and the light guide holes 1326 of the insertion elements 132a and 132b respectively correspond to two opposite ends of the optical waveguide element 120. To be specific, the light guide holes 1326 of the insertion elements 132a and 132b correspond to the two opposite sides of the core layer 124 of the optical waveguide element 120. As provided above, the light beam transmitted through the optical waveguide element 120 may be totally reflected at the intersections of the bottom coverage layer 122, the core layer 124, and the top coverage layer 126 of the optical waveguide element 120. Hence, the light beam provided by the optical-electro element 134a aligned to the core layer 124 can be transmitted to the optical-electro element 134b aligned to the core layer 124 directly through the optical waveguide element 120 along the core layer 124, and the light loss can be reduced. As a result, the optical component 100 described herein can achieve favorable optical efficiency.

In the present embodiment, each of the optical-electro assemblies 130a and 130b further includes a conductive layer 136 and a metal layer 138. The conductive layer 136 is located on the corresponding insertion elements 132a and 132b, e.g., on the surfaces of the insertion portion 1322 and the light guide portion 1324, and the optical-electro elements 134a and 134b are located on one end of the light guide portion 1324 of each of the corresponding insertion elements 132a and 132b away from the optical waveguide element 120, so as to be connected to the corresponding conductive layer 136. A material of the conductive layer 136 may be copper or another appropriate conductive material, which should not be construed as a limitation to the invention. Through the conductive layer 136 located on the insertion portions 1322 and the light guide portions 1324, the optical-electro elements 134a and 134b may be electrically connected to the circuit layer 114 of the multi-layer substrate 110 after the insertion elements 132a and 132b are inserted into the corresponding through holes 116a and 116b. Besides, the metal layer 138 is located in the light guide hole 1326 of each of the insertion elements 132a and 132b. A material of the metal layer 138 may be silver or another appropriate metallic material, which should not be construed as a limitation to the invention. Due to the metal layer 138 located in the light guide hole 1326, the reflection rate of the light beam passing through the light guide hole 1326 can be increased. However, the conductive layer 136 and the metal layer 138 are not required elements in the invention, and whether to include the conductive layer 136 and the metal layer 138 may be determined according to actual needs.

Figure 3:
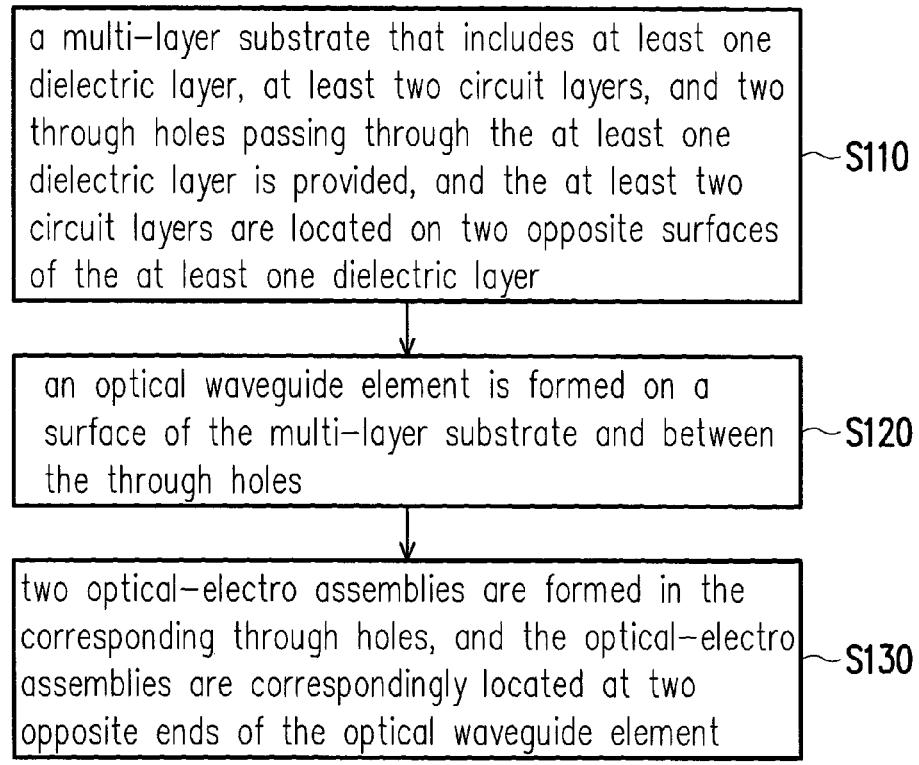
FIG. 3 is a flowchart illustrating a method for manufacturing the optical component shown in FIG. 2.
Figure 4A:
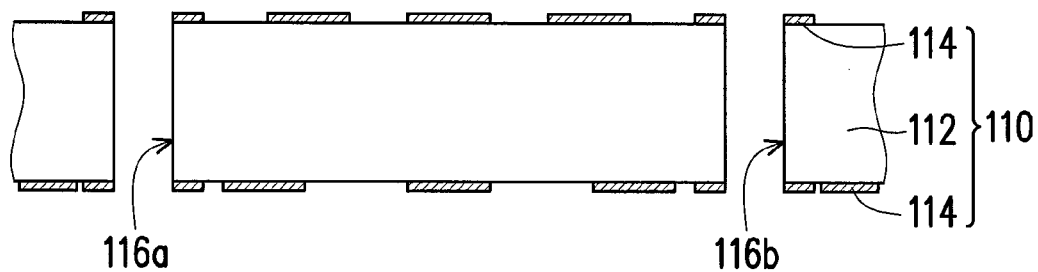
FIG. 4A to FIG. 4C are schematic diagrams illustrating a process for manufacturing the optical component shown in FIG. 2.
Figure 4B:
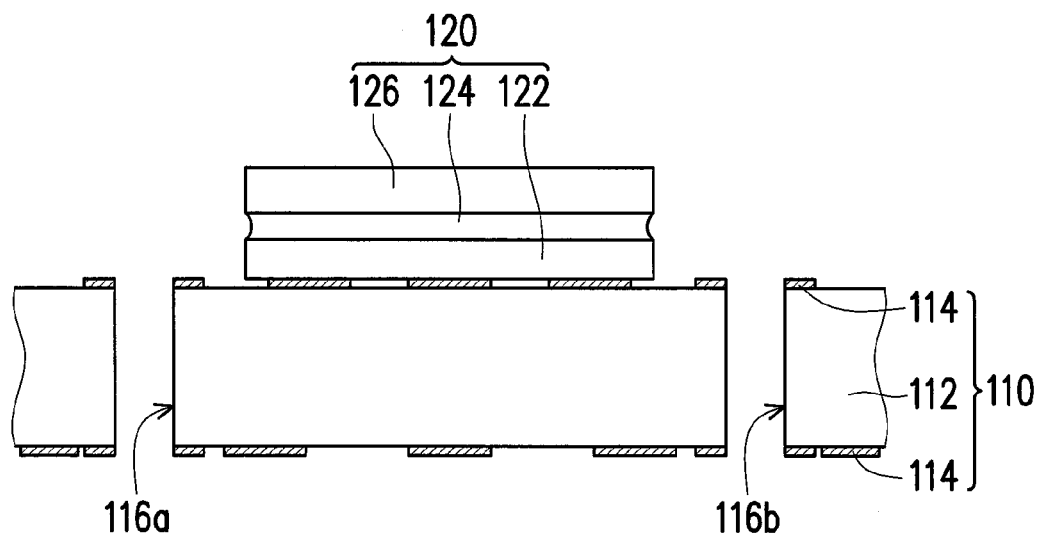
Figure 4C:
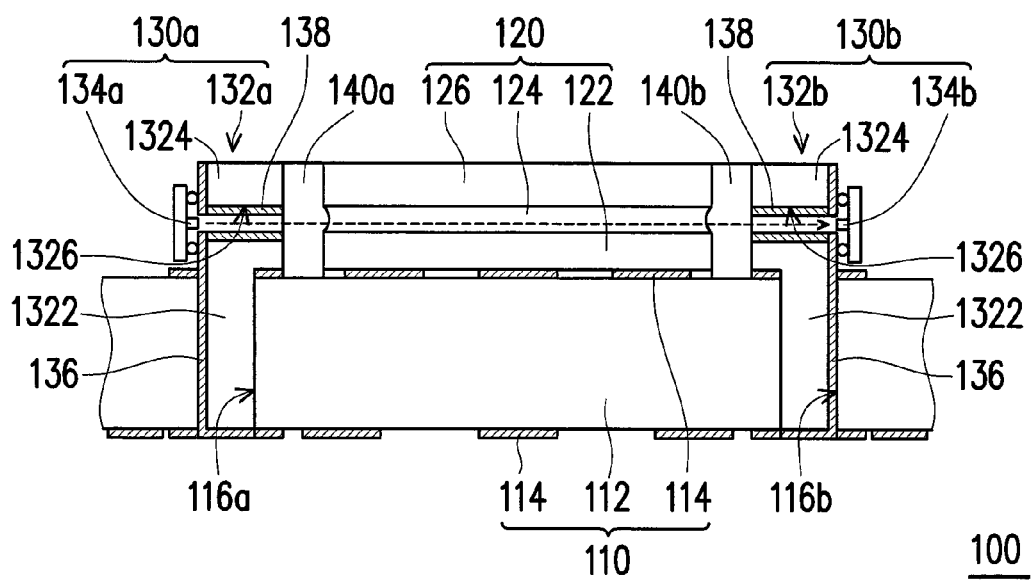

FIG. 3 is a flowchart illustrating a method for manufacturing the optical component shown in FIG. 2. FIG. 4A to FIG. 4C are schematic diagrams illustrating a process for manufacturing the optical component shown in FIG. 2. With reference to FIG. 3, in the present embodiment, a manufacturing method of the optical component 100 includes following steps. In step S110, a multi-layer substrate that includes at least one dielectric layer, at least two circuit layers, and two through holes passing through the at least one dielectric layer is provided, and the at least two circuit layers are located on two opposite surfaces of the at least one dielectric layer. In step S120, an optical waveguide element is formed on a surface of the multi-layer substrate and between the through holes. In step S130, two optical-electro assemblies are formed in the corresponding through holes, and the optical-electro assemblies are correspondingly located at two opposite ends of the optical waveguide element. The manufacturing method of the optical component 100 provided in the present embodiment is further explained below with reference to FIG. 3 and FIG. 4A to FIG. 4C.

With reference to FIG. 3 and FIG. 4A, in step S110, a multi-layer substrate 100 that includes at least one dielectric layer 112, at least two circuit layers 114, and two through holes 116a and 116b passing through the at least one dielectric layer 112 is provided, and the at least two circuit layers 114 are located on two opposite surfaces of the at least one dielectric layer 112. According to the present embodiment, the dielectric layer 112 is made of resin, glass fiber, or any other appropriate dielectric material, for instance, and the through holes 116a and 116b may be formed on the dielectric layer 112 through a drilling process or any other appropriate process. A material of the circuit layers 114 is copper or any other appropriate conductive material, for instance, the circuit layers 114 may be configured on two opposite surfaces of the dielectric layer 112 through performing a plating process or any other appropriate manufacturing process, and circuit patterns may be formed by performing a lithography process or any other appropriate manufacturing process according to the required circuit layout. In other embodiments that are not shown in the drawings, the number of the dielectric layer and the number of the circuit layer in the multi-layer substrate may be adjusted according to actual demands and should not be construed as a limitation to the invention.

With reference to FIG. 3 and FIG. 4B, in step S120, an optical waveguide element 120 is formed on a surface of the multi-layer substrate 110 and between the through holes 116a and 116b. According to the present embodiment, the optical waveguide element 120 is located on the surface of the multi-layer substrate 110; here, the optical waveguide element 120 includes the bottom coverage layer 122, the core layer 124, and the top coverage layer 126 that are sequentially stacked from bottom to top on the surface of the multi-layer substrate 110. The optical waveguide element 120 may be formed on the multi-layer substrate 110 by performing an appropriate manufacturing process, and the optical waveguide element 120 may serve to transmit a light beam. The refractive index of the bottom coverage layer 122 and the top coverage layer 126 is smaller than that of the core layer 124; therefore, when the optical waveguide element 120 is configured to transmit the light beam, the light beam may be totally reflected at the intersections of the bottom coverage layer 122, the core layer 124, and the top coverage layer 126 of the optical waveguide element 120. The description of the optical waveguide element 120 is provided above and thus will not be further given hereinafter.

With reference to FIG. 3 and FIG. 4C, in step S130, two optical-electro assemblies 130a and 130b are formed in the corresponding through holes 116a and 116b, and the optical-electro assemblies 130a and 130b are correspondingly located at two opposite ends of the optical waveguide element 120. Thereby, one of the optical-electro assemblies 130a and 130b (e.g., the optical-electro assembly 130a) transforms an electrical signal into a light beam and provides the light beam to the optical waveguide element 120, and the other one of the optical-electro assemblies (e.g., the optical-electro assembly 130b) receives the light beam transmitted from the optical waveguide element 120 and transforms the light beam into another electrical signal.

According to the present embodiment, in the method of forming the optical-electro assemblies 130a and 130b in the corresponding through holes 116a and 116b (step S130), the optical-electro assemblies 130a and 130b are formed before the optical component 100 is manufactured. Thereby, in step S130, the resultant optical-electro assemblies 130a and 130b can be directly inserted into the corresponding through holes 116a and 116b. The method of forming the optical-electro assemblies 130a and 130b into the corresponding through holes 116a and 116b is described below with reference to FIG. 5A to FIG. 5C.

Figure 5A:
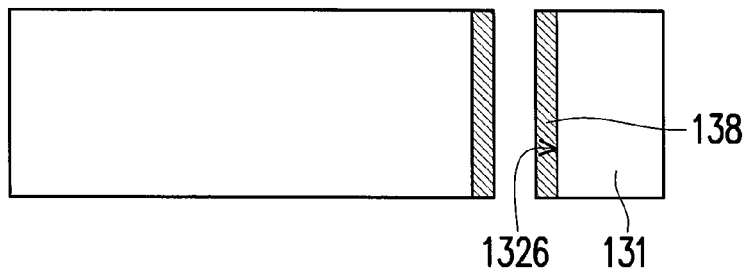
FIG. 5A to FIG. 5C are schematic diagrams illustrating a process for manufacturing optical-electro assemblies adopted in the optical component shown in FIG. 2.
Figure 5B:
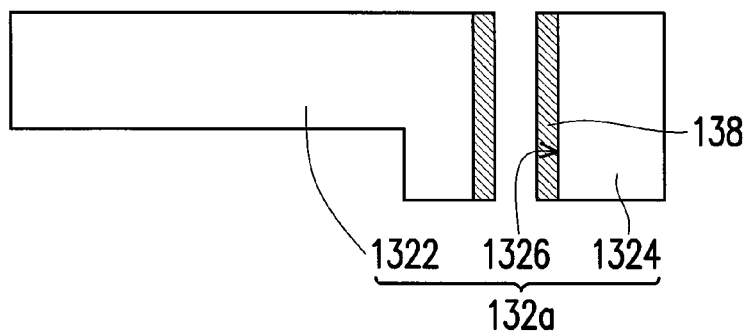
Figure 5C:
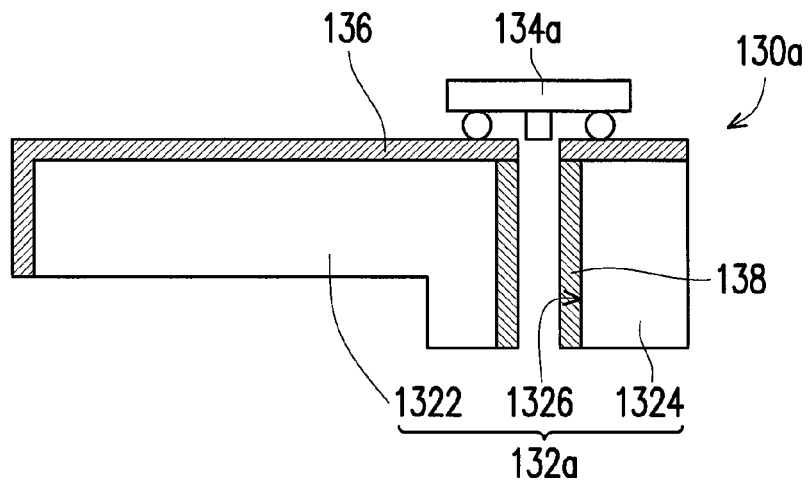

FIG. 5A to FIG. 5C are schematic diagrams illustrating a process for manufacturing optical-electro assemblies adopted in the optical component shown in FIG. 2. In the present embodiment, the optical-electro assemblies 130a and 130b adopted in the optical component 100 are already formed before the optical component 100 is manufactured. Steps of providing the exemplary optical-electro assembly 130a are elaborated below with reference to FIG. 5A to FIG. 5C.

With reference to FIG. 5A, a substrate 131 is provided, and a light guide hole 1326 is formed passing through the substrate 131. In the present embodiment, the substrate 131 may be a printed circuit board (PCB), a copper foil substrate, a silicon substrate, or a substrate made of metal, acrylate, an injection molding material, or a combination of organic or inorganic materials. Neither the material nor the type of the substrate 131 is limited in the invention, i.e., the material and the type of the substrate 131 may be determined according to actual needs. The light guide hole 1326 passing through the substrate 131 is formed on the substrate 131 by performing a drilling process or any other appropriate manufacturing process. Besides, the metal layer 138 may be formed in the light guide hole 1326 through performing a plating process or any other appropriate manufacturing process. A material of the metal layer 138 may be silver or another appropriate metallic material. Due to the metal layer 138 located in the light guide hole 1326, the reflection rate of the light beam passing through the light guide hole 1326 can be increased; however, whether to form the metal layer 138 in the optical-electro assembly is not limited in the invention.

With reference to FIG. 5B, the substrate 131 is cut to form an insertion element 132a that includes an insertion portion 1322 and a light guide portion 1324 connected to the insertion portion 1322, and the light guide hole 1326 is located on the light guide portion 1324 and passes through the light guide portion 1324. According to the present embodiment, the insertion element 132a is designed to be shaped as a bolt, such that the insertion element 132a may be inserted into the corresponding through hole 116a (shown in FIG. 2) and may be properly positioned. That is, the width of the light guide portion 1324 of the insertion element 132a is greater than the width of the insertion portion 1322, such that the insertion element 132a is shaped as a bolt. Besides. the width of the insertion portion 1322 of the insertion element 132a does not exceed the width of the corresponding through hole 116a, such that the insertion portion 1322 may be inserted into the through hole 116a; the width of the light guide portion 1324 of the insertion element 132a is greater than the width of the through hole 116a, so as to position the insertion element 132a through the light guide portion 1324 after the insertion element 132a is inserted into the through hole 116a through the insertion portion 1322. Similarly, the insertion element 132b may be completely formed by performing the same steps.

With reference to FIG. 5C, the conductive layer 136 is formed on the insertion element 132a, and the optical-electro element 134a is placed on the corresponding light guide portion 1324, so as to connect the conductive layer 136 and face the light guide hole 1326; thereby, the optical-electro assembly 130a is formed. In the present embodiment, the step of providing the optical-electro assembly 130a further includes: forming the conductive layer 136 on the insertion element 132a before placing the optical-electro element 134a, and the optical-electro element 134a is then placed on the corresponding light guide portion 1324 and connected to the conductive layer 136. Namely, before the optical-electro element 134a is placed on the corresponding light guide portion 1324, a plating process or another appropriate manufacturing process may be performed to form the conductive layer 136 on the insertion portion 1322 and the light guide portion 1324 of the insertion element 132a. Here, the material of the conductive layer 136 may be copper or any other appropriate conductive material, which should however not be construed as a limitation to the invention. The optical-electro element 134a is then placed on the light guide portion 1324 of the insertion element 132a and connected to the corresponding conductive layer 136, and the optical-electro element 134a faces the light guide hole 1326. Through the conductive layer 136 located on the insertion portions 1322 and the light guide portions 1324, the optical-electro element 134a may be electrically connected to the circuit layer 114 of the multi-layer substrate 110 after the insertion element 132a is inserted into the corresponding through hole 116a. Similarly, the optical-electro element 134b may be placed on the insertion element 132b by performing the same manufacturing steps, so as to form the optical-electro assembly 130b. Here, the optical-electro assembly 130a includes the insertion element 132a, the conductive layer 136, and the optical-electro element 134a, the optical-electro assembly 130b includes the insertion element 132b, the conductive layer 136, and the optical-electro element 134b, and each of the optical-electro elements 134a and 134b is placed on the light guide portion 1324 of one of the corresponding insertion elements 132a and 132b and faces the light guide hole 1326. After the optical-electro assemblies 130a and 130b are completely formed, the resultant optical-electro assemblies 130a and 130b may be used in the optical component 100; for instance, the optical-electro assemblies 130a and 130b may be directly inserted into the corresponding through holes 116a and 116b during the fabrication of the optical component 100.

With reference to FIG. 4C, in the step of forming the optical-electro assemblies 130a and 130b in the corresponding through holes 116a and 116b (step S130) provided in the present embodiment, after the optical-electro assemblies 130a and 130b are formed by performing said steps, the optical-electro assemblies 130a and 130b can be inserted into the through holes 116a and 116b through the insertion portions 1322 of the insertion elements 132a and 132b. At this time, the light guide portion 1324 and the light guide hole 1326 of each of the insertion elements 132a and 132b corresponds to one end of the core layer 124 of the optical waveguide element 120, such that each of the optical-electro element 134a and 134b is located on one end of the corresponding light guide portion 1324 away from the core layer 124 of the optical waveguide element 120. Thereby, the light beam provided by the optical-electro element 134a may be transmitted to the core layer 124 of the optical waveguide element 120 through the corresponding light guide hole 132b, and the optical-electro element 134b may receive the light beam transmitted by the core layer 124 of the optical waveguide element 120 through the corresponding light guide hole 132b.

Additionally, the manufacturing method of the optical component 100 provided in the present embodiment further includes: placing two light focusing lenses 140a and 140b on two opposite sides of the optical waveguide element 120 before the step of inserting the optical-electro assemblies 130a and 130b into the corresponding through holes 116a and 116b (step S130); after the step of inserting the optical-electro assemblies 130a and 130b into the corresponding through holes 116a and 116b (step 130), each of the optical-electro assemblies 130a and 130b faces one of the corresponding light focusing lenses 140a and 140b. As such, the light beam transmitted by the optical-electro assembly 130a can be transmitted to the core layer of the optical waveguide element 120 through the corresponding light focusing lens 140a, and the light beam is then transmitted to the optical-electro assembly 130b through the core layer and the corresponding light focusing lens 140b, so as to enhance the light beam transmission effects. However, the light focusing lenses 140a and 140b are not required elements in the invention.

Figure 6:
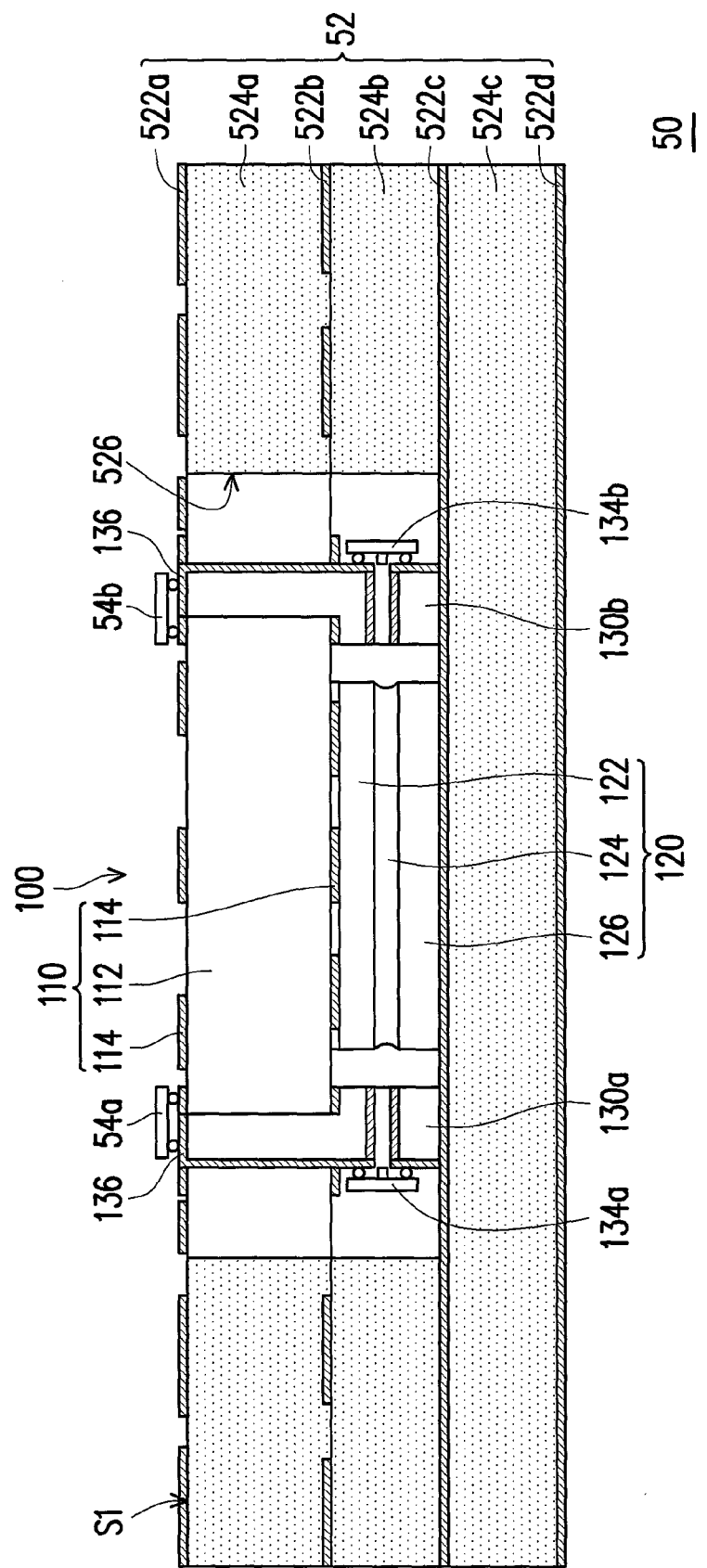
FIG. 6 is a schematic diagram illustrating that the optical component depicted in FIG. 2 is applied in an optical-electro circuit board.

FIG. 6 is a schematic diagram illustrating that the optical component depicted in FIG. 2 is applied in an optical-electro circuit board. With reference to FIG. 2 and FIG. 6, in the present embodiment of the invention, an optical-electro circuit board 50 includes a multi-layer circuit board 52, an optical component 100, and two chip 54a and 54b. Specifically, the multi-layer circuit board 52 includes a plurality of circuit layers 522a to 522d and a plurality of dielectric layers 524a to 524c between the circuit layers 522a to 522d. In FIG. 6, the multi-layer circuit board 52 has four circuit layers 522a to 522d and three dielectric layers 524a to 524c, for instance, which should however not be construed as a limitation to the invention. The circuit layers 522a to 522d and the dielectric layers 524a to 524c in the multi-layer circuit board 52 are sequentially stacked. A material of the circuit layers 522a to 522d is copper or any other appropriate conductive material, for instance, and the circuit layers 522a to 522d may be configured between the dielectric layers 524a to 524c through performing a plating process or any other appropriate manufacturing process. Besides, circuit patterns may be formed by performing a lithography process or any other appropriate manufacturing process according to the required circuit layout. In addition, the dielectric layers 524a to 524c are made of resin, glass fiber, or any other appropriate dielectric material, for instance, and through holes or blind holes that are not shown may be formed on the dielectric layers 524a to 524c through a drilling process or any other appropriate process, such that the circuit layers 522a to 522d may be electrically conducted through the through holes or the blind holes. Besides, the multi-layer circuit board 52 has a groove 526 extending from a surface S1 of the multi-layer circuit board 52 into the circuit layers 522a to 522d.

According to the present embodiment of the invention, the optical component 100 includes a multi-layer substrate 110, an optical waveguide element 120, and two optical-electro assemblies 130a and 130b whose structures are already described above and will not be further elaborated hereinafter. The optical component 100 is arranged in an upside down manner and assembled into the groove 526 of the multi-layer circuit board 50. Here, the optical waveguide element 120 of the optical component 100 faces a bottom of the groove 526, and the optical-electro elements 134a and 134b of the optical-electro assemblies 130a and 130b located on two opposite ends of the optical waveguide element 120 are also located at the bottom of the groove 526. The chips 54a and 54b are located outside the groove 526 and electrically connected to the optical-electro assemblies 130a and 130b of the optical component 100, respectively, so as to provide the electrical signal to the optical component 100, or receive the electrical signal from the optical component 100.

In particular, the chips 54a and 54b described herein are located on the corresponding optical-electro assemblies 130a and 130b, so as to be electrically connected to the corresponding optical-electro assemblies 130a and 130b. To be more specific, the chips 54a and 54b are located on the circuit layer 136 of the corresponding optical-electro assemblies 130a and 130b, so as to be electrically connected to the corresponding optical-electro elements 134a and 134b through the conductive layer 136. One of the chips 54a and 54b (e.g., the chip 54a) is a driver chip capable of providing an electrical signal, while the other one of the chips (e.g., the chip 54b) is a reception chip capable of receiving an electrical signal. Thereby, the chip 54a is able to provide an electrical signal to the optical-electro element 130a, so as to drive the optical-electro element 134a of the optical-electro assembly 130a to transform the electrical signal into a light beam; as such, the optical-electro assembly 130a provides the light beam to the optical waveguide element 120. The light beam is then transmitted to the optical-electro assembly 130b through the optical waveguide element 120. The optical-electro element 134b of the optical-electro assembly 130b receives the light beam transmitted from the optical waveguide element 120 and transforms the light beam into an electrical signal, and the chip 54b is capable of receiving the electrical signal transmitted from the corresponding optical-electro assembly 130b.

In light of the foregoing, the optical component 100 in the optical-electro circuit board 50 described in the present embodiment is arranged in an upside down manner and assembled to the groove 526 of the multi-layer circuit board 52, such that the optical waveguide element 120 and the optical-electro elements 134a and 134b of the optical-electro assemblies 130a and 130b are all located at the bottom of the groove 526. Hence, the light beam transmission path in the optical component 100 described herein is within the groove 526, so as to reduce light loss. As a result, the optical-electro circuit board 50 described herein can achieve favorable optical efficiency. In addition, according to the present embodiment, the optical waveguide element 120 and the optical-electro assemblies 130a and 130b configured to transmit the light beam are integrated into the optical component 100, the optical component 100 provided herein may be directly applied in the multi-layer circuit board 52. That is, when the multi-layer circuit board 52 is to be equipped with the optical-electro elements (e.g., the aforesaid electricity-to-light element or light-to-electricity element) in order to assemble the optical-electro circuit board 50, the optical component 100 that is already formed can be arranged in an upside down manner and assembled into the groove 526 of the multi-layer circuit board 52 according to the present embodiment instead of configuring individual elements separately on the multi-layer circuit board 52. As a result, the optical-electro circuit board 50 described herein can be assembled and aligned in a relatively simple manner. Moreover, the optical component 100 provided in the present embodiment is embedded in the groove 526 of the multi-layer circuit board 52, and thus no additional space for configuring said optical-electro elements on the surface of the multi-layer circuit board 52 is required. As such, the space required for surface layout may be reduced in the optical-electro circuit board 50 described herein.

Namely, the dimension of the optical-electro circuit board 50 may be adjusted according to actual needs, and not only the optical-electro elements but also other electronic devices may be configured on the optical-electro circuit board 50.

Figure 7:
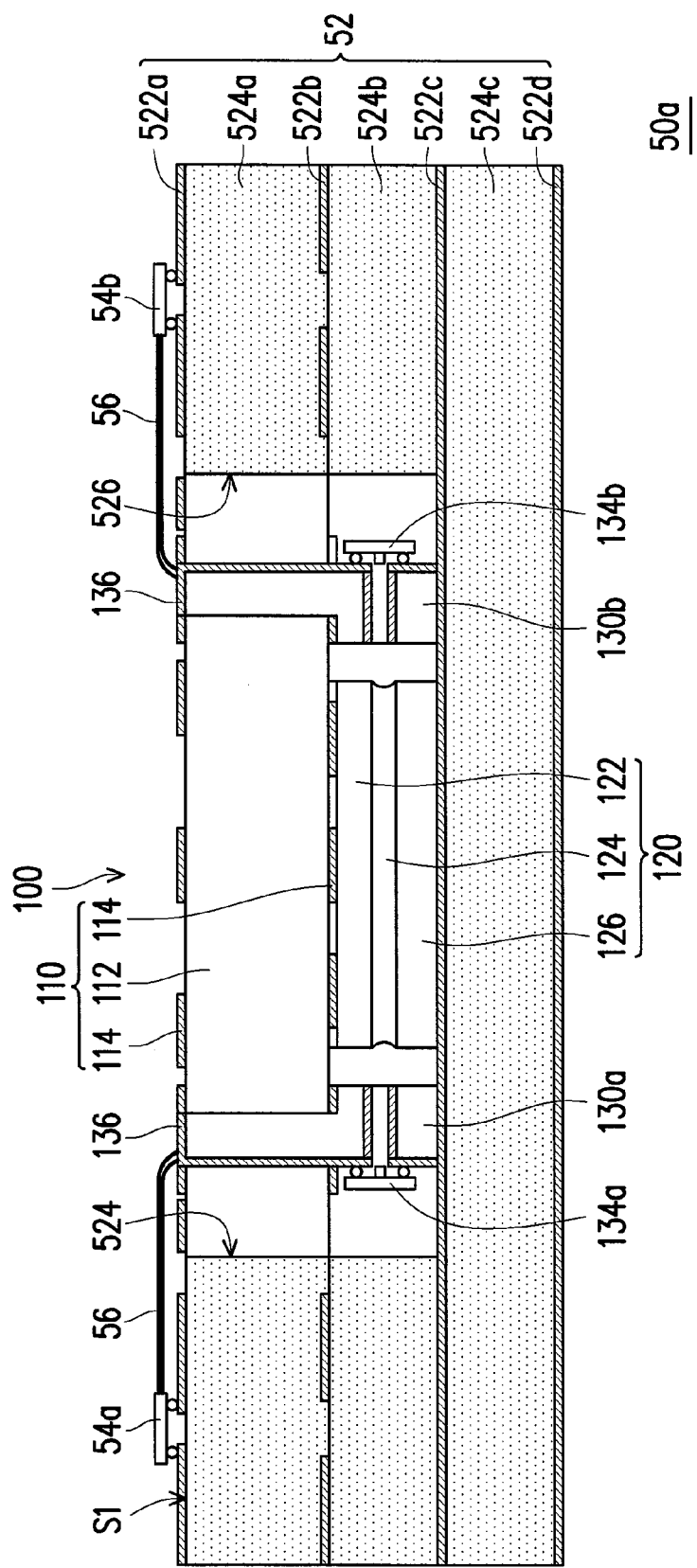
FIG. 7 is a schematic view illustrating an optical-electro circuit board according to another embodiment of the invention.

FIG. 7 is a schematic view illustrating an optical-electro circuit board according to another embodiment of the invention. With reference to FIG. 2 and FIG. 7, the structure of the optical-electro circuit board 50a provided in the present embodiment is similar to that of the optical-electro circuit board 50 depicted in FIG. 6, while the difference therebetween lies in that the chips 54a and 54b located outside the groove 526 are actually placed on the surface S1 of the multi-layer circuit board 52 and connected to the corresponding optical-electro assemblies 130a and 130b through a plurality of corresponding bonding wires 56. In particularly, the chips 54a and 54b are located on the circuit layer 522a of the multi-layer circuit board 52 and on two respective sides of the groove 526. Here, circuit patterns are already formed on the circuit layer 522a according to the required circuit layout by performing the lithography process or any other appropriate manufacturing process, and the chips 54a and 54b are placed on the circuit patterns of the circuit layer 522, so as to be electrically connected to the multi-layer circuit board 52. In addition, the chips 54a and 54b are connected to the conductive layers 136 of the corresponding optical-electro assemblies 130a and 130b through the corresponding bonding wires 56, so as to be electrically connected to the corresponding optical-electro elements 134a and 134b through the conductive layers 136. It can be derived from the above that the way to configure the chips 54a and 54b is not limited in the invention and may be adjusted according to actual needs.

To sum up, in the optical component and the manufacturing method described herein, two optical-electro assemblies are inserted into two through holes of the multi-layer substrate, such that the optical-electro assemblies are located at two respective sides of the optical waveguide element. One of the optical-electro assemblies transforms an electrical signal into a light beam and directly transmits the light beam to the optical waveguide element, and the other one of the optical-electro assemblies directly receives the light beam transmitted from the optical waveguide element and transforms the light beam into another electrical signal, so as to reduce light loss. Thereby, the optical component and the manufacturing method thereof described herein can achieve favorable optical efficiency. Moreover, the optical waveguide element and the optical-electro assemblies configured to transmit the light beam are integrated into the optical component that can be arranged in an upside down manner and assembled into the groove of the multi-layer circuit board of the optical-electro circuit board. That is, the optical component in the optical-electro circuit board described herein is arranged in an upside down manner and assembled into the groove of the multi-layer circuit board, such that the light beam transmitted between the optical-electro assemblies and the optical waveguide element is within the groove. As such, the optical-electro circuit board described herein is capable of ensuring favorable optical efficiency and can be assembled and aligned in a relatively simple manner, and enabled to reduce the space required for surface layout.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. An optical component comprising:
   a multi-layer substrate comprising at least one dielectric layer, at least two circuit layers, and two through holes passing through the at least one dielectric layer, the at least two circuit layers being located on two opposite surfaces of the at least one dielectric layer;
   an optical waveguide element located on a surface of the multi-layer substrate and between the through holes; and
   two optical-electro assemblies respectively inserted into the corresponding through holes and correspondingly located at two opposite ends of the optical waveguide element, each of the optical-electro assemblies comprises an insertion element comprising an insertion portion, and the insertion portion is inserted into the corresponding through hole, wherein one of the optical-electro assemblies transforms an electrical signal into a light beam and provides the light beam to the optical waveguide element, and other one of the optical-electro assemblies receives the light beam transmitted from the optical waveguide element and transforms the light beam into another electrical signal.

2. The optical component according to claim 1, wherein each of the optical-electro assemblies further comprises:
   a conductive layer located on the insertion element; and
   an optical-electro element located on the insertion element, wherein the insertion element further comprises a light guide portion connected to the insertion portion and a light guide hole passing through the light guide portion, the light guide portion and the light guide hole is located corresponding to one end of the optical waveguide element, and the optical-electro element is located on one end of the corresponding light guide portion away from the optical waveguide element, connected to the conductive layer and facing the light guide hole, so as to transmit the light beam to the optical waveguide element through the light guide hole or receive the light beam transmitted by the optical waveguide element through the light guide hole.

3. The optical component according to claim 2, wherein a width of each of the light guide portions is greater than a width of one of the corresponding through holes, so as to position the insertion element through the light guide portion after the insertion element is inserted into the corresponding through hole through the insertion portion.

4. The optical component according to claim 1, further comprising two light focusing lenses located on two opposite sides of the optical waveguide element, each of the optical-electro assemblies facing one of the corresponding light focusing lenses.

* * * * *